(12) United States Patent
Håkansson

(10) Patent No.: US 9,491,551 B2
(45) Date of Patent: Nov. 8, 2016

(54) NETWORK FOR BONE CONDUCTION TRANSDUCERS

(75) Inventor: Bo Håkansson, Göteborg (SE)

(73) Assignee: Osseofon AB, Göteborg (SE)

( * ) Notice: Subject to any disclaimer, the term of this patent is extended or adjusted under 35 U.S.C. 154(b) by 0 days.

(21) Appl. No.: 13/880,081

(22) PCT Filed: Nov. 11, 2011

(86) PCT No.: PCT/SE2011/000204
§ 371 (c)(1),
(2), (4) Date: Apr. 18, 2013

(87) PCT Pub. No.: WO2012/064247
PCT Pub. Date: May 18, 2012

(65) Prior Publication Data
US 2013/0208935 A1    Aug. 15, 2013

(30) Foreign Application Priority Data

Nov. 12, 2010  (SE) ........................................ 1001105

(51) Int. Cl.
| | |
|---|---|
| *H03G 5/00* | (2006.01) |
| *H04R 25/00* | (2006.01) |
| *H04R 3/08* | (2006.01) |
| *H03G 5/24* | (2006.01) |
| *H03G 5/02* | (2006.01) |
| *H03H 7/38* | (2006.01) |
| *H04R 11/00* | (2006.01) |

(52) U.S. Cl.
CPC ............... *H04R 25/00* (2013.01); *H04R 3/08* (2013.01); *H03G 5/00* (2013.01); *H03G 5/025* (2013.01); *H03G 5/24* (2013.01); *H03H 7/38* (2013.01); *H04R 11/00* (2013.01); *H04R 25/606* (2013.01); *H04R 2460/13* (2013.01)

(58) Field of Classification Search
USPC ..................................... 381/99, 98, 326, 103
See application file for complete search history.

(56) References Cited

U.S. PATENT DOCUMENTS

| | | | |
|---|---|---|---|
| 3,838,216 A | 9/1974 | Watkins | |
| 4,597,100 A * | 6/1986 | Grodinsky | ............... H04R 3/14 381/99 |
| 5,636,147 A | 6/1997 | Tolmie et al. | |
| 7,471,801 B2 * | 12/2008 | Hakansson | ............ H04R 9/025 381/326 |
| 2005/0135651 A1 | 6/2005 | Hakansson | |
| 2005/0282503 A1 | 12/2005 | Onno et al. | |
| 2009/0121960 A1 | 5/2009 | Sangawa | |

FOREIGN PATENT DOCUMENTS

| | | |
|---|---|---|
| EP | 0912073 A2 | 4/1999 |
| WO | WO 2005/029915 A1 | 3/2005 |
| WO | WO 2010/110713 A1 | 9/2010 |

OTHER PUBLICATIONS

International Search Report, Mar. 14, 2012, from International Phase of the instant application.
Extended European Search Report.

* cited by examiner

*Primary Examiner* — Amir Etesam
(74) *Attorney, Agent, or Firm* — Cahn & Samuels, LLP

(57) ABSTRACT

An electrical network for driving electromagnetic bone conduction vibrator/transducer of variable reluctance type which is applied between the vibrator terminals and the power amplifier terminals so that the vibrator mechanical output is maximized in the mid and high frequencies.

3 Claims, 3 Drawing Sheets a)

b)

NETWORK FOR BONE CONDUCTION TRANSDUCERS

TECHNICAL FIELD

The present invention relates to a new device to connect an electromagnetic vibrator of variable reluctance type to an amplifier output stage in order to increase the maximum force output in bone conduction applications.

STATE OF ART

Hearing aids of bone conduction type has been known for a long time and uses the principle that a vibrator/speaker is applied to the skin behind the ear with a constant pressure. The vibrator is driven by an amplifier and the signal originates from a microphone or in some applications from an audiometer or other signal generators. In the 1980, the bone-anchored hearing aid was introduced where the vibrator is connected to a skin penetrating and bone-anchored titanium implants, see eg U.S. Pat. No. 4,498,461. Bone conduction devices are also used in communications equipment where you want the ear canal to be free and in audiometric equipment for testing hearing thresholds and speech recognition scores.

In bone conduction applications, usually an electromagnetic vibrator of variable reluctance type is used. As shown in the definition below, this is a completely different kind of vibrator/transducer than electromagnetic vibrators of moving coil type that are common in conventional air speakers. It is also very different from a vibrator of piezoelectric type. Vibrators of moving coil and piezoelectric type are not used in bone conduction applications due that the mechanical load by the skull bone is quite different than the load of free air. One problem with variable reluctance vibrators is that they have an input impedance which is predominately inductive especially at mid and high frequencies. Since output force generation is current controlled this means that the high frequency gain in bone conduction applications are poor as it will be limited battery voltage which typically is only 1-1.5 Volt. This is the main reason that the frequency curve in FIG. 1a, as calculated by the conventional electromechanical analogy model as shown in FIG. 1b, decreases with increasing frequency for frequencies above this first mechanical resonance frequency f0. In FIG. 1b, internal impedance of the vibrator is represented by an ideal inductor L in series with a resistor R. In the prior art the vibrator is directly connected to an amplifier represented by an ideal voltage generator Vg in series with the output impedance Rg (Thevinins equivalent) in FIG. 1b. As a consequence, it is well known that bone-anchored hearing aids have a limited force output at mid and high frequencies and that they therefore have limited ability to compensate for a sensorineural hearing loss. It is also well known that in the application for the treatment of unilateral (single sided) deafness a higher amplification the sound of the high frequency range is desired in order to better compensate for the sound shadow at these frequencies.

One way to increase the high frequency (hereinafter also referred to the treble frequency range) gain is to include a mechanical filter between the vibrator output and the mechanical load, as shown by PCT/SE2010/000066, and SE 533047.

Another way to increase the output force in a specific frequency range is described in patent U.S. Pat. No. 7,471,801, in which a capacitor is connected in series with the electrical terminals of the vibrator. One drawback with this approach is that the output force at lower frequencies will be reduced as the capacitor blocks the signal. The same patent (U.S. Pat. No. 7,471,801) also shows a solution to minimize power consumption at the carrier frequency (which is typically >100kHz) in switched-mode power amplifier by using a capacitor placed in parallel with the vibrator electrical terminals. This solution has therefore nothing to do with maximizing the force output at the high frequency range. Instead, the purpose of the solution disclosed in U.S. Pat. No. 7,471,801, is to minimize power dissipation in switched-mode power amplifier by a capacitor connected in parallel with the vibrator. In this way the internal inductance L creates a tuned parallel resonance at a frequency well above the hearing range, where this resonance due to its high impedance reduces power consumption at the fundamental of switch frequency.

The present invention relates instead to a method of increasing the force output in variable reluctance vibrators/transducers at mid and high frequencies in audible hearing range through an intermediate passive circuit network of electrical components placed in between the amplifier and vibrator terminals.

SUMMARY OF THE INVENTION

The present invention relates to increase the force output from electromagnetic vibrator of variable reluctance type at mid and high frequencies by introducing an intermediate passive electric circuit network between the vibrator and the driving voltage source. The driving voltage source is also known as the power amplifier.

In a preferred embodiment, the power amplifier output is loaded with a passive circuit network consisting of an inductor in series with a first capacitor where the vibrator electrical terminals are connected across the capacitor. Inductor and capacitor values are then determined so that the voltage across the capacitor is maximized for the treble (high frequency) range.

In another embodiment, a second capacitor connected in parallel with a resistor which is then placed in series with the vibrator so that the mid frequency range receives additional gain.

These described embodiments may be performed separately or in combination.

DEFINITIONS

Figure 1:
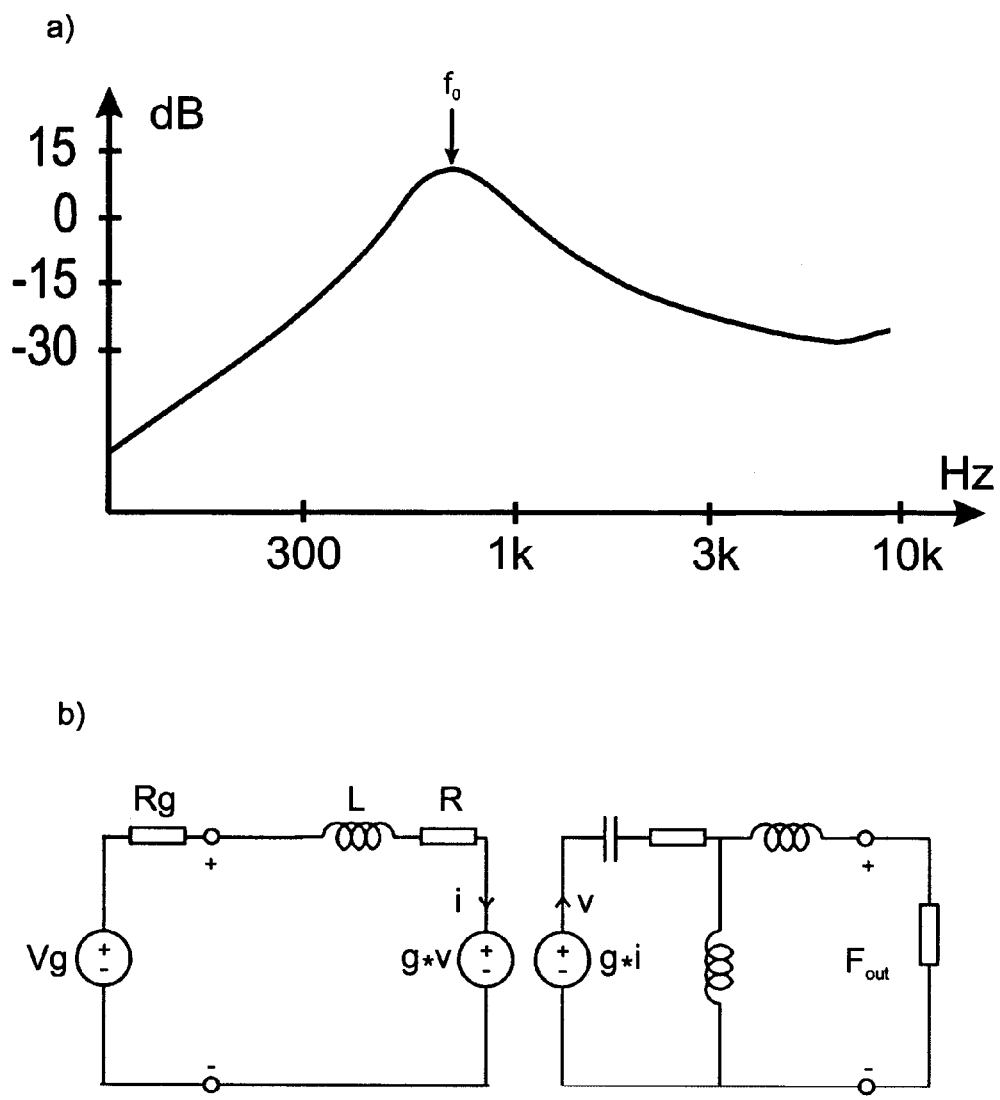
FIG. 1a, b: Current state of the art regarding electromechanical model and the frequency response of an electromagnetic vibrator of the variable reluctance type.

This document use words and expressions defined in more detail below.

Variable Reluctance Vibrator

A rather long definition is given here not to be mistaken for a moving coil type or a piezo electric type transducer/vibrator. With variable reluctance vibrator is defined as an electromagnetic vibrator which the applied signal current generates a dynamic magnetic flux enclosed in a magnetic closed loop circuit that has one or more relatively thin air gap (−s) between the vibrator drive and load side (counter weight side) and where the air gaps constitute a significant part of the magnetic reluctance (magnetic resistance) in the circuit. One or more permanent magnets generates a static magnetic flux which at least in the air gaps are superimposed on the dynamic magnetic flux and hence attractive/repulsive dynamic forces are then generated across the air gaps synchronously with the signal current. These dynamic forces make the vibrator drive and load side (counter weight side) to move relative to each other and hence the air gap length change synchronously which thus the magnetic reluctance varies synchronously giving its name "Variable reluctance type transducer". Because the coil is enclosing the magnetic circuit and the magnetic circuit has low magnetic reactance its inductance L will be high and also its force generation capacity is high. The high inductance has a drawback as it reduces the flow of current and thereby reduces force generation especially at mid and high frequencies (the impedance of an inductor increases with frequency). In vibrators of moving coil type (ordinary air speakers) forces are generated in a completely different way and the air gaps are static (the motion of the moving coil is perpendicular to the air gap). As the moving coil is attached to the sound radiating membrane it shall have a light weight (thus have few turns) its impedance is low and essentially resistive in the auditory frequency range.

BEST—Balanced Electromagnetic Separation Transducer

A BEST transducer is an electromagnetic variable reluctance type vibrator but with opposing air gaps for balancing the static forces and where the static and dynamic magnetic fluxes are separated except in and near the air gap, see U.S. Pat. Nos. 6,751,334, 7,471,801, and 7,827,671.

Electrical Input Impedance

The electrical input impedance is the ratio between an applied voltage and the resulting current into the vibrator electrical terminals.

Power Amplifier

A Power amplifier is defined as an electrical amplifier that transfers the electrical signal energy in an efficient way and drives the speaker/vibrator. The output impedance of the Power amplifier is the impedance seen at its output terminals. The Power amplifier is sometimes called the output stage and it can be either analog or digital (switched).

Audible Frequency Range

The audible frequency range extends from 20, to 20 kHz for normal hearing humans, but a reduction in sensitivity occur at varying degree in patients with congenital or acquired hearing loss. The loss of hearing increases with age and are more common at higher frequencies in the audible frequency range.

Treble Frequency Range

The treble frequency range is defined as the high frequency range, which refers to the frequency range from approximately 1 kHz and above.

Bass Frequency Range

The bass frequency range is defined as the low frequency range from approximately 1, k Hz and lower.

Mid Frequency Range

The mid frequency range overlaps with the bass and treble frequency range and relates to the approximately 800-2 kHz.

DETAILED DESCRIPTION OF THE INVENTION

Figure 2:
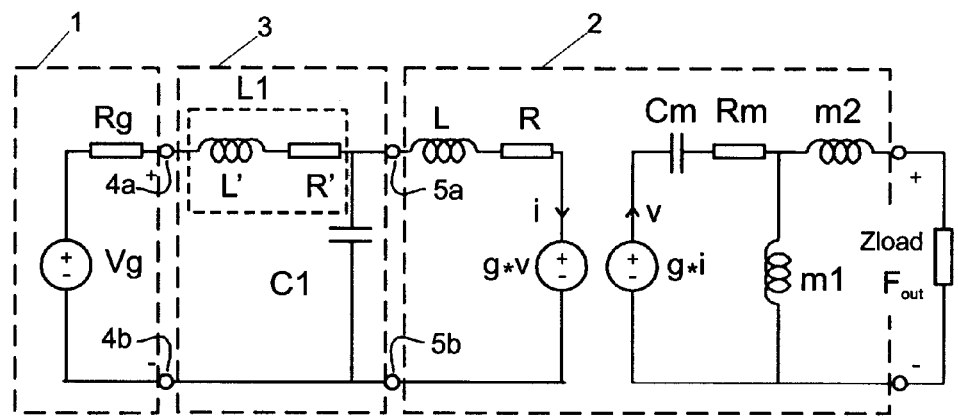
FIG. 2a, b: A preferred embodiment of the proposed invention.
Figure 2:
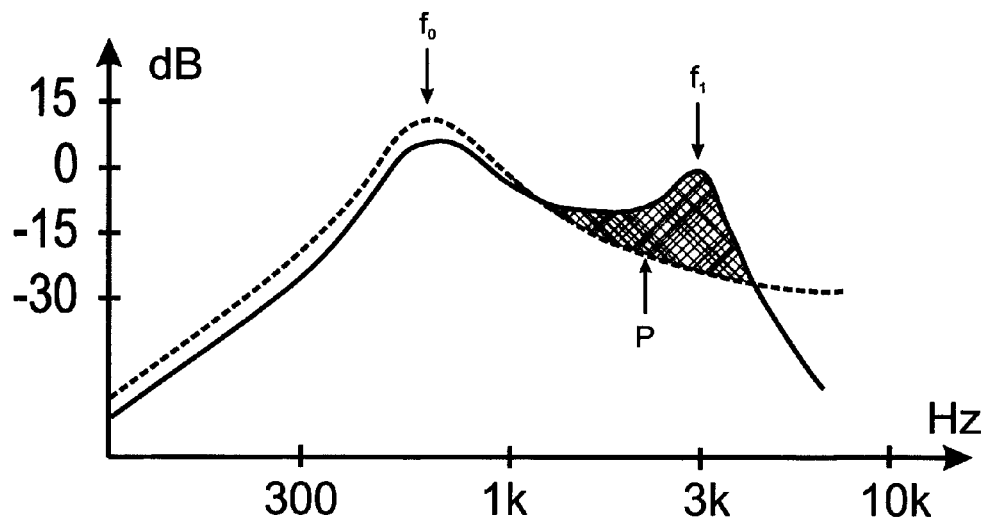

A preferred embodiment of the present invention is shown in FIG. 2. FIG. 2a, the hearing aid amplifier with output power amplifier 1 is represented by a Thévenin equivalent circuit, consisting of an ideal voltage source Vg and its output impedance Rg. The vibrator is modeled on a recognized but simplistic way (eg. by neglecting frequency-dependent losses) as an electro-mechanical analogy model 2 where the electric side of the vibrator consists of the inductance L of the coil and its ohmic losses R. The mechanical side of the vibrator consists suspension spring compliance Cm and its damping Rm while the counter weight mass m1 and the driving mass m2 couples the signal power to the mechanical load Zload. The mechanical resonance f0 formed by appropriate choice of Cm and m1 is given approximately by $f0 \cong 1/\text{sqrt}[2\pi(m1*Cm)]$ where sqrt[ ] represents the square root operator. In this preferred embodiment an electrical network 3, comprising an inductor L1 in series with a first capacitor C1, is connected to the power amplifier terminals 4a, b. The vibrator terminals 5a, b, is then connected in parallel across the capacitor C1.

The inductor L1 is consists of a coil that is not ideal and is represented here by a pure inductance L' series with a resistor R' representing its ohmic losses. As is shown in FIG. 2b, the values of L1 and C1 are chosen so that an electrically generated resonance f1 is formed in the treble frequency range. The electrically generated resonance frequency is given approximately by the relationship of a lossless resonance which is $f1 \cong 1/\text{sqrt}[2\pi(L'*C1)]$. FIG. 2b, also shows the frequency response P (prior art) of a vibrator according to known technique where the hatched area between the curves indicates the gain obtained. The Q-value that determines the smoothness of the peak around f1 can be changed by a first resistor (modifying the damping) connected in series with either L1 or C1 (not shown).

Figure 3:
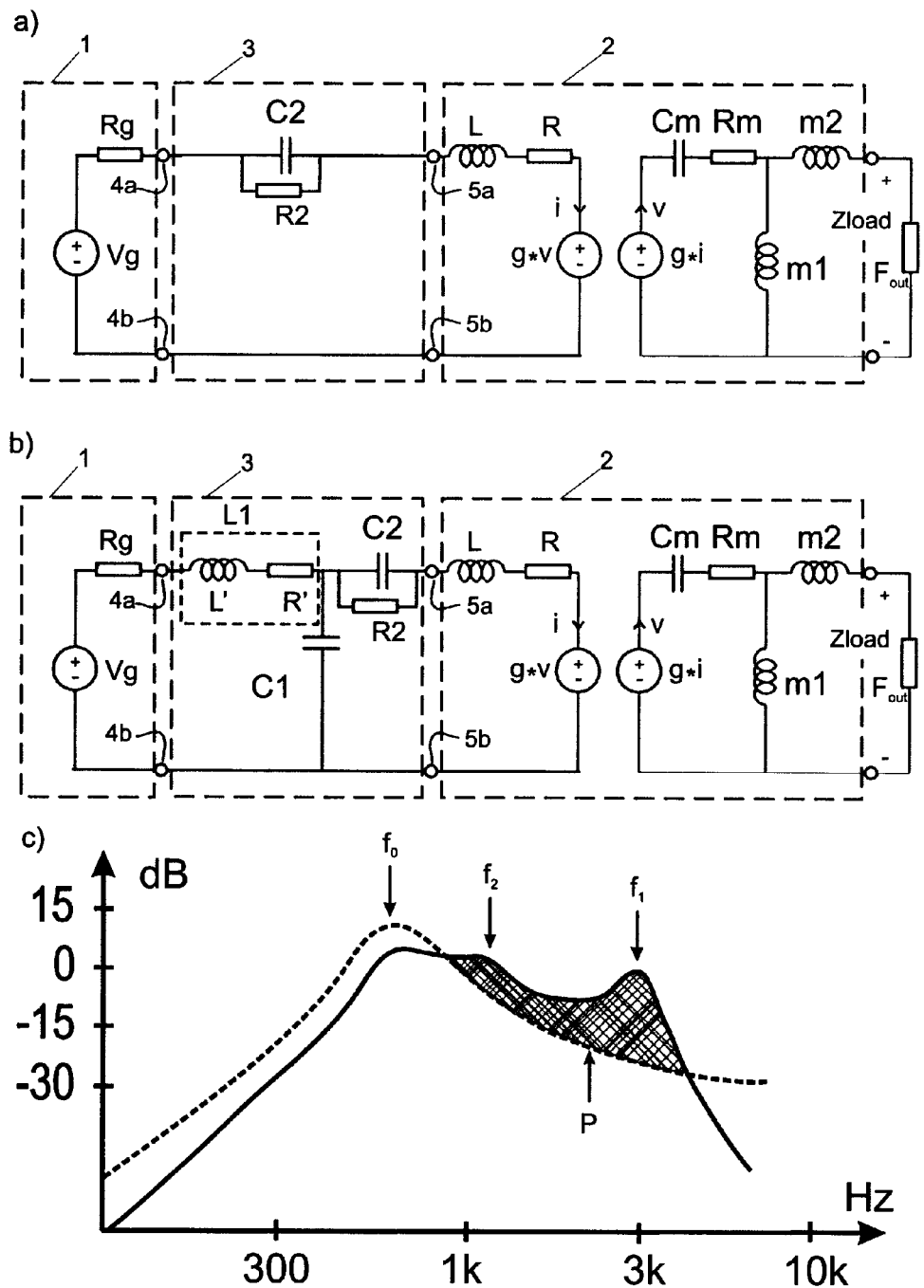
FIG. 3a, b, c: Further proposed embodiments of the proposed invention (a, b) and the resulting frequency response (c).

Another preferred embodiment is shown in FIG. 3. Here a second capacitor C2 is placed in series between the power amplifiers terminals 4a, b, and vibrator terminals 5a, b, whose capacitance is chosen so that the vibrator inductance from impedance point of view is balanced out in the mid frequency range and thus the vibrator can have an increased output force level in this frequency range. The disadvantage is that the vibrator output force level is considerably decreases at low frequencies. This problem is reduced if a second resistor R2 is placed in parallel with the capacitor C2, as also shown in FIG. 3a. By combining the solution as shown in FIG. 2a, with a solution as shown in FIG. 3a, the network shown in FIG. 3b, is obtained and thus an increased force output can be achieved in a wider frequency range as shown in FIG. 3c.

Although a limited number of embodiments such as have been proposed to describe the present invention, it is obvious that a technically competent person in the field can change or add electrical components without departing from the foundations of this invention as defined in the following patent claims.

REFERENCES LIST

1 Electrical power amplifier
2 Electro-mechanical analogy model of benledningsvibrator
3 Electrical networks to increase kraftutnivån for a benledningsvibrator
4a, b, Electrical terminals to the output power amplifier
5a, b, Electrical terminals to the vibrator

REFERENCES

U.S. Pat. No. 4,498,461, A coupling to a Bone Conduction Hearing Aid
U.S. Pat. No. 6,751,334, Electromagnetic vibrator U.S. Pat. No. 7,471,801, Means at electromagnetic vibrator
U.S. Pat. No. 7,827,671, Method for the Manufacture of balanced transducers
SE 533 047, Bone Conduction Transducer with Improved High Frequency Response

The invention claimed is:

1. A hearing aid comprising:
a power amplifier including first and second amplifier output terminals;
an electromagnetic vibrator, of variable reluctance type, configured to generate bone conduction vibrations in the audible range, and including first and second input terminals and a mechanical output; and
a device including a coil and a capacitor coupled in series between the first and second output terminals,
wherein the first input terminal of the electromagnetic vibrator is coupled between the coil and the capacitor, and wherein the second input terminal of the electromagnetic vibrator is coupled between ths capacitor and the second output terminal of the power amplifier, and
wherein an inductance, resistance, and capacitance of the device produce a resonance in the treble frequency range of the audible frequency range,
the hearing aid further including a resistor coupled in parallel with a second capacitor,
the resistor and second capacitor being coupled in series with first and second input terminals, wherein a resistance of the resistor and a capacitance of the second capacitor are chosen so that an inductance of the electromechanical vibrator is outbalanced or substantially outbalanced thereby increasing a mechanical output in the mid frequency range.

2. A hearing aid according to claim 1 wherein the inductance, resistance, and capacitance of the device produce a local maximum of the mechanical output in the treble frequency range of the audible frequency range.

3. A hearing aid according to claim 1 wherein the inductance, resistance, and capacitance of the device are configured to increase the mechanical output in high frequency range of the audible frequency range.

* * * * *